(12) United States Patent
Someya et al.

(10) Patent No.: US 11,894,492 B2
(45) Date of Patent: Feb. 6, 2024

(54) LIGHT EMITTING ELEMENT AND REFLECTIVE-TYPE ENCODER

(71) Applicant: HAMAMATSU PHOTONICS K.K., Hamamatsu (JP)

(72) Inventors: Shota Someya, Hamamatsu (JP); Takayuki Hoshino, Hamamatsu (JP); Shunji Suzuki, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 18/090,002

(22) Filed: Dec. 28, 2022

(65) Prior Publication Data
US 2023/0215989 A1    Jul. 6, 2023

(30) Foreign Application Priority Data
Jan. 4, 2022 (JP) .................... 2022-000133

(51) Int. Cl.
  *H01L 33/46* (2010.01)
  *G01D 5/347* (2006.01)
  *H01L 25/16* (2023.01)
  *H01L 33/20* (2010.01)

(52) U.S. Cl.
  CPC .......... *H01L 33/46* (2013.01); *G01D 5/3473* (2013.01); *H01L 25/167* (2013.01); *H01L 33/20* (2013.01)

(58) Field of Classification Search
  CPC ....... H01L 33/46; H01L 25/167; H01L 33/20; H01L 33/385; H01L 33/44; G01D 5/3473; G01D 5/34715
  See application file for complete search history.

(56) References Cited

U.S. PATENT DOCUMENTS

| | | | | |
|---|---|---|---|---|
| 7,883,910 B2* | 2/2011 | Tsai | ..................... | H01L 25/167 372/1 |
| 8,237,185 B2* | 8/2012 | Park | ..................... | H01L 25/167 257/30 |

FOREIGN PATENT DOCUMENTS

JP    2014-216598 A    11/2014

* cited by examiner

*Primary Examiner* — Seung C Sohn
(74) *Attorney, Agent, or Firm* — Faegre Drinker Biddle & Reath LLP (57) ABSTRACT

A light emitting element includes: a substrate; a mesa portion formed on the substrate and including an active layer, a first semiconductor layer, and a second semiconductor layer; a metal layer including a first metal part disposed on a top surface of the mesa portion and connected to the second semiconductor layer and a second metal part formed integrally with the first metal part and extending along a side surface of the mesa portion; an insulating layer formed on the side surface; and a resin layer formed on the insulating layer. The first metal part includes an opening region formed with a light passage opening and a connection region for external connection. The second metal part is formed on the side surface via the insulating layer and the resin layer and overlaps the active layer when viewed in a direction perpendicular to a thickness direction of the substrate.

14 Claims, 7 Drawing Sheets

LIGHT EMITTING ELEMENT AND REFLECTIVE-TYPE ENCODER

TECHNICAL FIELD

One aspect of the present disclosure relates to a light emitting element and a reflective-type encoder.

BACKGROUND

Japanese Unexamined Patent Publication No. 2014-216598 discloses a light emitting element applicable as a light source for a reflective-type encoder and including a substrate and a mesa portion formed on the substrate. In this light emitting element, a light emitting window is formed on the top surface of the mesa portion, and light is emitted from the light emitting window along the thickness direction of the substrate.

When the light emitting element described above is applied to a reflective-type encoder, light that has leaked out of the side surface of the mesa portion may be detected as noise by a light receiving element of the reflective-type encoder to result in a decline in detection accuracy.

SUMMARY

An object of one aspect of the present disclosure is to provide a light emitting element capable of suppressing a decline in detection accuracy when applied to a reflective-type encoder and a reflective-type encoder including such a light emitting element.

A light emitting element according to one aspect of the present disclosure includes: a substrate; a mesa portion including an active layer that generates light, a first semiconductor layer disposed on a side of the substrate with respect to the active layer, and a second semiconductor layer disposed on a side opposite to the substrate with respect to the active layer and formed on the substrate; a metal layer including a first part disposed on a top surface of the mesa portion and electrically connected to the second semiconductor layer and a second part formed integrally with the first part and extending along a side surface of the mesa portion; an insulating layer formed at least on the side surface of the mesa portion; and a resin layer formed on the insulating layer, in which the first part includes a region formed with a light passage opening through which the light passes and a region for external connection, and the second part is formed on the side surface of the mesa portion via the insulating layer and the resin layer and overlaps at least the active layer when viewed in a direction perpendicular to a thickness direction of the substrate.

In this light emitting element, the metal layer includes the second part formed integrally with the first part and extending along the side surface of the mesa portion in addition to the first part disposed on the top surface of the mesa portion and electrically connected to the second semiconductor layer, and the second part overlaps at least the active layer when viewed in a direction perpendicular to the thickness direction of the substrate. As a result, light leaking out of the side surface of the mesa portion can be blocked by the second part, and leakage light from the side surface of the mesa portion can be suppressed. In addition, it may be impossible to satisfactorily form the metal layer simply by forming the metal layer on the side surface of the mesa portion. On the other hand, the second part of the metal layer in this light emitting element is formed on the side surface of the mesa portion via the insulating layer and the resin layer. As a result, the second part of the metal layer can be satisfactorily formed on the side surface of the mesa portion and leakage light from the side surface of the mesa portion can be effectively suppressed. Therefore, according to this light emitting element, a decline in detection accuracy can be suppressed in the case of application to a reflective-type encoder.

The second part may reach an end portion of the mesa portion on the side of the substrate when viewed in the direction perpendicular to the thickness direction of the substrate. In this case, leakage light from the side surface of the mesa portion can be suppressed more effectively.

The top surface of the mesa portion may be formed in a rectangular shape having a pair of first sides extending along a first direction and a pair of second sides extending along a second direction perpendicular to the first direction when viewed in the thickness direction of the substrate, the side surface of the mesa portion may include a pair of first surfaces respectively connected to the top surface on the pair of first sides and a pair of second surfaces respectively connected to the top surface on the pair of second sides, at the first part, the light passage opening may be formed closer to a side of one of the pair of first surfaces than a center of the top surface when viewed in the thickness direction of the substrate, and the second part may be formed at least on the one of the pair of first surfaces and the pair of second surfaces. In this case, the light passage opening is formed close to one of the pair of first surfaces at the first part of the metal layer, and thus the wide region for external connection can be ensured. As a result, for example, connection of external wiring to the region can be facilitated. Meanwhile, in that case, light is likely to leak out of the one of the pair of first surfaces. In this regard, in this light emitting element, the second part is formed at least on the one of the pair of first surfaces and the pair of second surfaces, and thus leakage light from the side surface of the mesa portion can be reliably suppressed even in such a case.

The second part may be formed over an entire circumference of the side surface of the mesa portion. In this case, leakage light from the side surface of the mesa portion can be suppressed more effectively.

The resin layer may include a part with a thickness decreasing toward the substrate. In this case, the surface of the resin layer on the side opposite to the mesa portion can be made gentle, and the second part of the metal layer can be more satisfactorily formed on the side surface of the mesa portion. In addition, light that has leaked out to the resin layer from the side surface of the mesa portion is attenuated by being repeatedly reflected between the side surface of the mesa portion and the second metal part of the metal layer. In the above configuration in which the resin layer includes the part decreasing in thickness toward the substrate, the number of reflections of the light that has leaked out to the resin layer increases, and thus the leakage light can be efficiently attenuated.

The side surface of the mesa portion may be formed in a curved surface shape convex toward an inside of the mesa portion. In this case, it is difficult to form the second part of the metal layer on the side surface of the mesa portion. However, according to this light emitting element, for the reason described above, the second part of the metal layer can be satisfactorily formed on the side surface of the mesa portion even in such a case.

A surface of the resin layer on a side opposite to the mesa portion may include a region formed in a curved surface shape convex toward the side opposite to the mesa portion.

In this case, the second part of the metal layer can be more satisfactorily formed on the side surface of the mesa portion.

The metal layer may cover an entire surface of the resin layer on a side opposite to the mesa portion. In this case, leakage light from the side surface of the mesa portion can be suppressed more effectively. In addition, deterioration of the resin layer attributable to contact with air can be effectively suppressed.

The resin layer may include a part formed on the top surface of the mesa portion and may not be formed between the region for external connection of the first part and the top surface of the mesa portion. In this case, the resin layer is formed not only on the side surface of the mesa portion but also on the top surface of the mesa portion, and thus the resin layer can be formed satisfactorily. In addition, since the resin layer is not formed between the region for external connection of the first part and the top surface of the mesa portion, the occurrence of a situation can be suppressed in which external wiring cannot be satisfactorily connected to the region for external connection due to the presence of the resin layer.

The resin layer may include a part formed on the top surface of the mesa portion, and the part of the resin layer formed on the top surface of the mesa portion may extend along an outer edge of the top surface of the mesa portion when viewed in the thickness direction of the substrate. In this case, the resin layer is formed not only on the side surface of the mesa portion but also on the top surface of the mesa portion, and thus the resin layer can be formed satisfactorily. In addition, the part of the resin layer formed on the top surface of the mesa portion extends along the outer edge of the top surface of the mesa portion when viewed in the thickness direction of the substrate, and thus the occurrence of a situation can be suppressed in which external wiring cannot be satisfactorily connected to the region for external connection due to the presence of the resin layer.

The insulating layer may include a part formed on the top surface of the mesa portion and covering an exposed part from the light passage opening. In this case, the exposed part from the light passage opening on the top surface of the mesa portion can be protected by the insulating layer.

The first part may be formed over an entire surface of the top surface of the mesa portion excluding a part corresponding to the light passage opening. In this case, the wide region for external connection can be ensured at the first part and, for example, connection of external wiring to the region can be facilitated. In addition, the first part is simpler in shape than when, for example, the first part is formed as a complicated wiring pattern, and thus the occurrence of an unintended short circuit between the first parts can be suppressed.

A reflective-type encoder according to one aspect of the present disclosure includes: the above light emitting element; a rotating plate including a reflection pattern that reflects the light emitted from the light emitting element; and at least one light receiving portion that is disposed on the same side as the light emitting element with respect to the rotating plate and detects the light reflected by the reflection pattern, in which the second part is formed at least on a region of the side surface of the mesa portion facing the at least one light receiving portion when viewed in the thickness direction of the substrate. According to this reflective-type encoder, the second part of the metal layer is capable of blocking leakage light incident on the at least one light receiving portion from the side surface of the mesa portion, and a decline in detection accuracy can be suppressed.

The at least one light receiving portion may include two light receiving portions respectively disposed on both sides of the light emitting element in the direction perpendicular to the thickness direction of the substrate, and the second part may be formed at least on two regions of the side surface of the mesa portion respectively facing the two light receiving portions when viewed in the thickness direction of the substrate. In this case, the second part of the metal layer is capable of blocking leakage light incident on the two light receiving portions disposed on both sides of the light emitting element from the side surface of the mesa portion.

According to one aspect of the present disclosure, it is possible to provide a light emitting element capable of suppressing a decline in detection accuracy when applied to a reflective-type encoder and a reflective-type encoder including such a light emitting element.

DETAILED DESCRIPTION

Hereinafter, an embodiment of the present disclosure will be described in detail with reference to the drawings. In the following description, the same reference numerals are used for the same or corresponding elements with redundant descriptions omitted.

Reflective-Type Encoder

Figure 1:
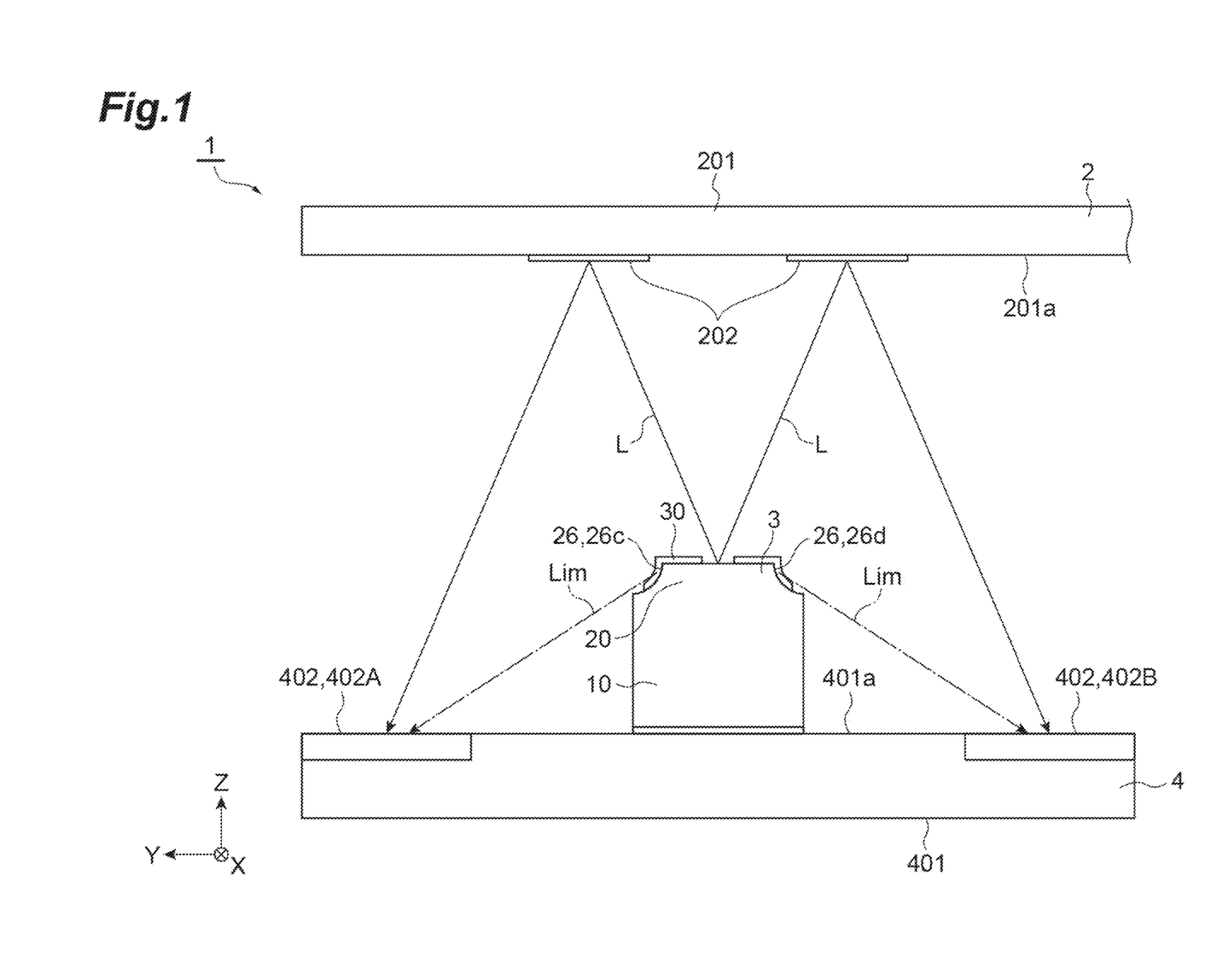
FIG. 1 is a front view of a reflective-type encoder according to an embodiment.

As illustrated in FIG. 1, a reflective-type encoder 1 includes a rotating plate (code wheel) 2, a light emitting element 3, and a light receiving element 4. The reflective-type encoder 1 is, for example, an absolute-type rotary encoder and is a device that detects the absolute angle of a rotating measurement target object using reflected light from the measurement target object.

The rotating plate 2 has a main body portion 201 and reflection pattern 202. The main body portion 201 is fixed to a rotating shaft (not illustrated) and rotates together with the rotating shaft. The main body portion 201 is formed in, for example, a disk shape. The reflection pattern 202 is formed on a main surface 201a of the main body portion 201. The reflection pattern 202 is, for example, a light reflection film formed of a metal such as Cr and reflects light L emitted from the light emitting element 3. The reflection pattern 202 is disposed in accordance with a predetermined pattern such as a Gray code.

The light emitting element 3 is a semiconductor element that outputs light and is, for example, a light emitting diode (LED). The light emitting element 3 is fixed on the light receiving element 4 so as to face the main surface 201a of the main body portion 201 and emits the light L toward the rotating plate 2. The light L emitted from the light emitting element 3 is reflected by the reflection pattern 202 and detected by a plurality of light receiving portions 402 of the light receiving element 4.

The light receiving element 4 is disposed on the same side as the light emitting element 3 with respect to the rotating plate 2. The light receiving element 4 has a base portion 401 and the plurality of light receiving portions 402 formed on the base portion 401. The base portion 401 is formed in, for example, a rectangular plate shape and has a main surface 401a facing the main surface 201a of the main body portion 201. The light emitting element 3 described above is fixed on the main surface 401a. Each light receiving portion 402 is, for example, a photodiode and detects the light L reflected by the reflection pattern 202. In this example, the plurality of light receiving portions 402 include two light receiving portions 402A and 402B. The two light receiving portions 402A and 402B are respectively disposed on both sides of the light emitting element 3 in the Y direction to be described later.

Light Emitting Element

Figure 3:
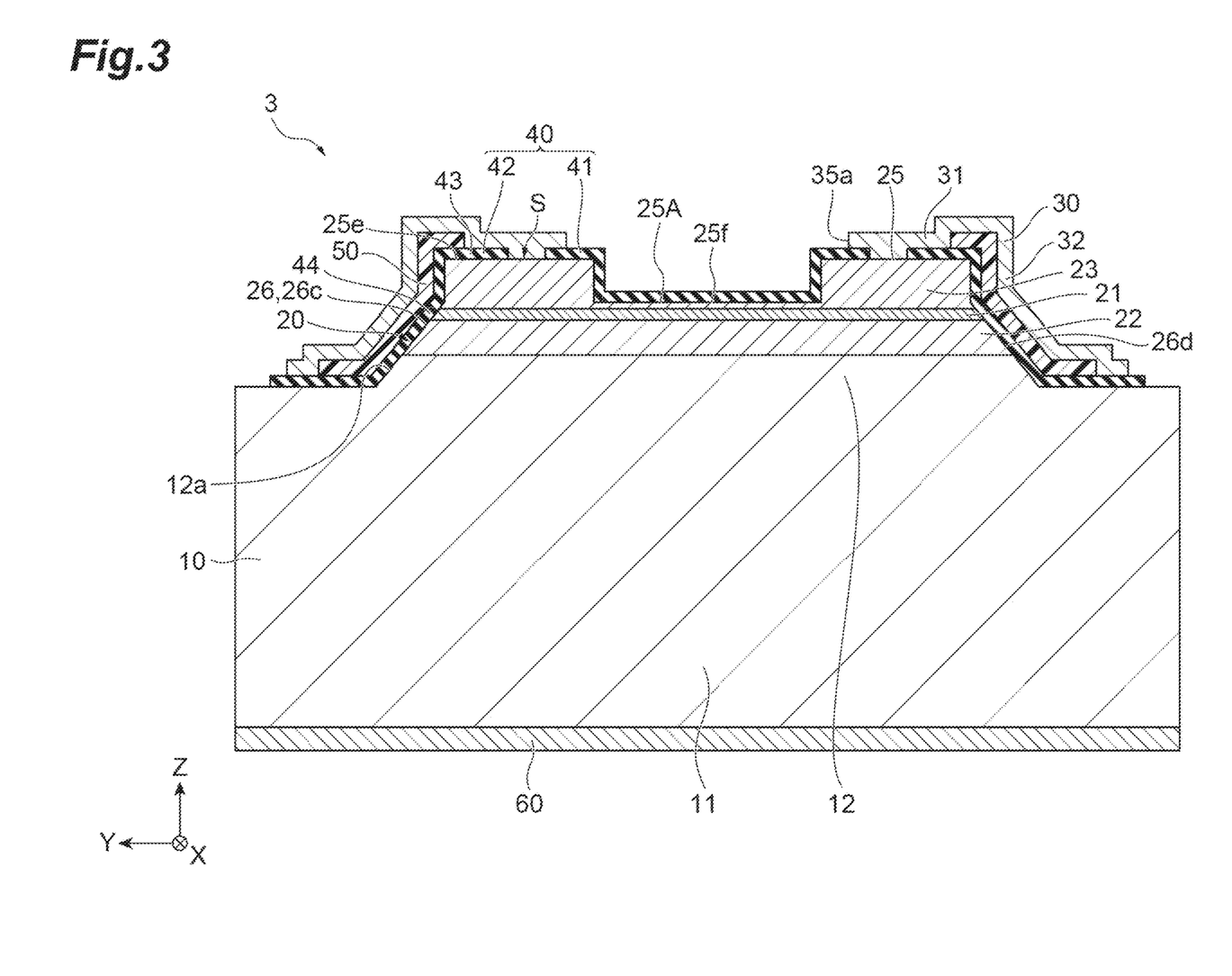
FIG. 3 is a cross-sectional view along line III-III of FIG. 2.
Figure 4:
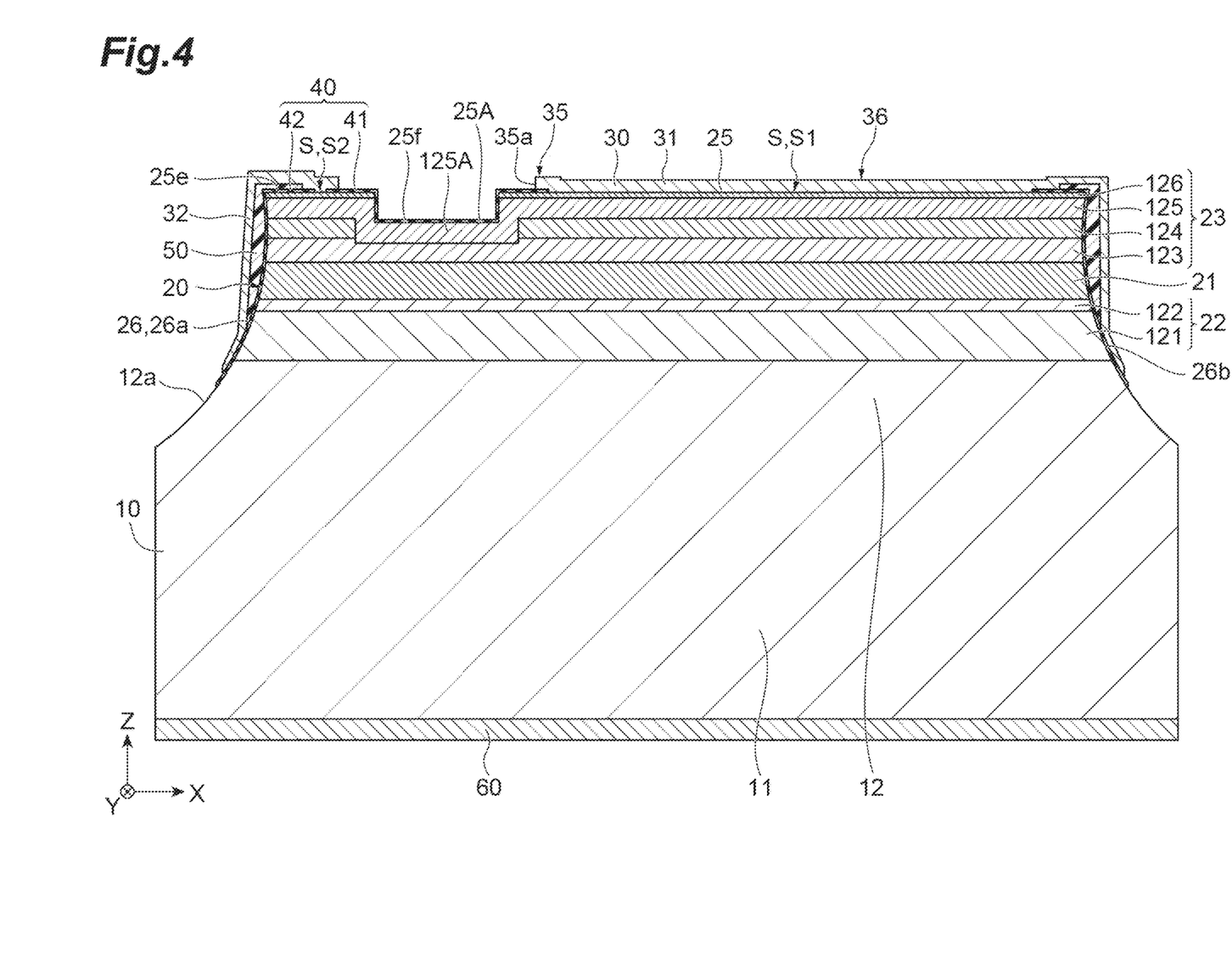
FIG. 4 is a cross-sectional view along line IV-IV of FIG. 2.
Figure 5:
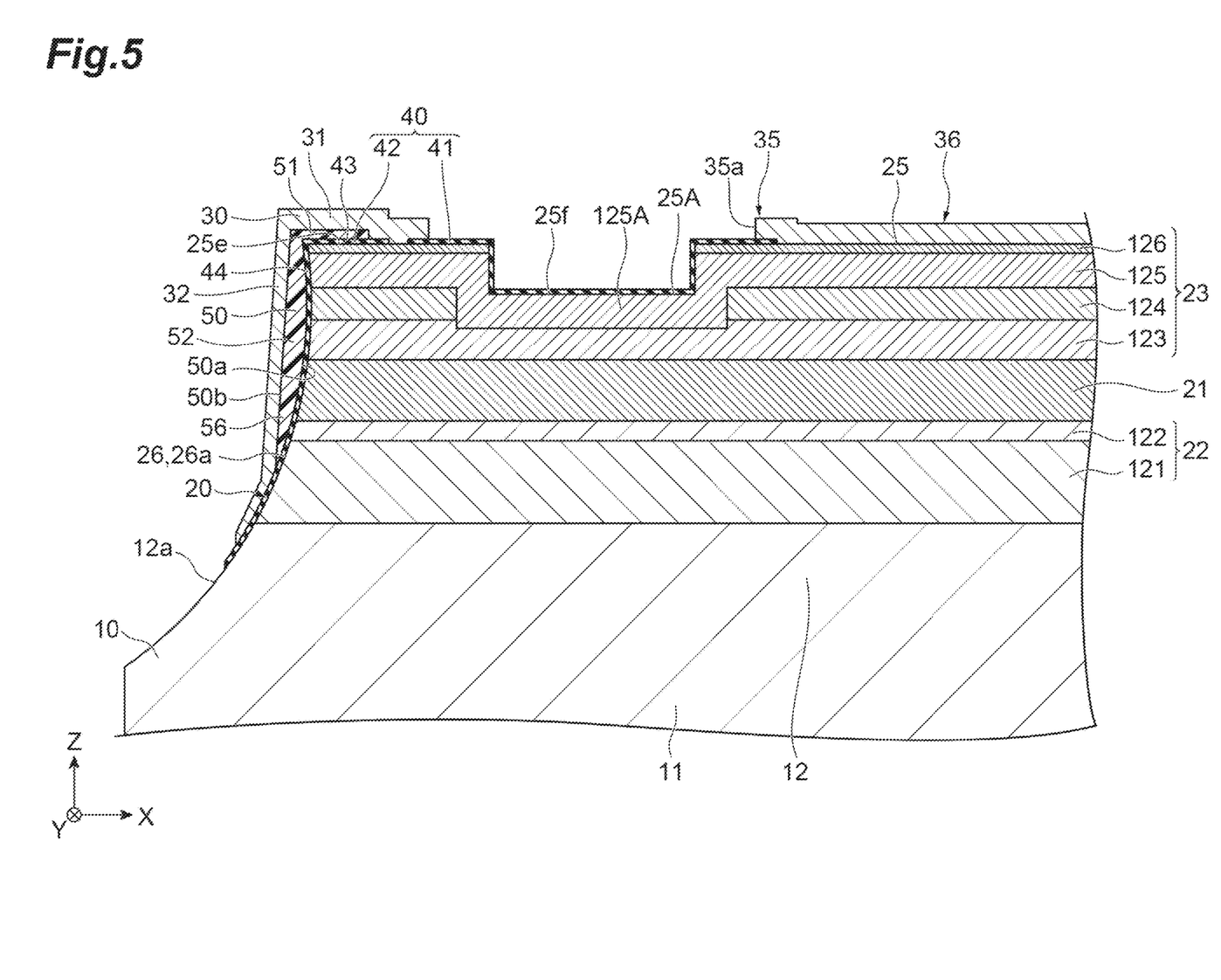
FIG. 5 is an enlarged view of a part illustrated in FIG. 4.

Next, the configuration of the light emitting element 3 will be further described. As illustrated in FIGS. 2 to 5, the light emitting element 3 includes a substrate 10, a mesa portion 20, a metal layer 30, an insulating layer 40, a resin layer 50, and an electrode 60. In FIGS. 3 to 5, the configuration of the light emitting element 3 is illustrated in a simplified manner. FIG. 4 is a diagram in which the configuration of the light emitting element is illustrated in more detail than in FIG. 3, and the configuration of the actual light emitting element as seen in the YZ cross section may have the same features as the configuration illustrated in FIG. 4 (configuration as seen in the XZ cross section). The substrate 10 is a semiconductor substrate and is formed of, for example, GaAs in a substantially rectangular plate shape. In the following description, the Z direction is the thickness direction of the substrate 10, the X direction is perpendicular to the Z direction, and the Y direction is perpendicular to the Z and X directions.

The substrate 10 has a base portion 11 and a protruding portion 12 protruding from the base portion 11. In this example, the base portion 11 is formed in a rectangular plate shape (rectangular parallelepiped shape). The protruding portion 12 protrudes from the surface of the base portion 11. The protruding portion 12 is, for example, formed in a substantially trapezoidal shape in a cross section along the Z direction. The electrode 60 is formed on the surface of the base portion 11 on the side opposite to the mesa portion 20. The electrode 60 is formed in a layer shape and of, for example, a metal material such as AuGe, Ni, and Au.

The mesa portion 20 is formed on the protruding portion 12 of the substrate 10. The mesa portion 20 is formed in, for example, a substantially trapezoidal shape in a cross section along the Z direction. The mesa portion 20 includes an active layer 21, a first semiconductor layer 22, and a second semiconductor layer 23. The protruding portion 12 and the mesa portion 20 are formed by, for example, stacking the active layer 21, the first semiconductor layer 22, and the second semiconductor layer 23 on the substrate 10 and then partially removing the substrate 10, the active layer 21, the first semiconductor layer 22, and the second semiconductor layer 23 by etching. The active layer 21 has, for example, a multiple quantum well structure and generates light of a predetermined wavelength by being supplied with a current.

The first semiconductor layer 22 is disposed on the substrate 10 side with respect to the active layer 21. The first semiconductor layer 22 is configured by stacking a distributed Bragg reflector (DBR) layer 121 and a cladding layer 122 on the protruding portion 12 of the substrate 10 in this order. The DBR layer 121 reflects light from the active layer 21 to the active layer 21 side (upper side in FIG. 5). The cladding layer 122 has, for example, n-type conductivity.

The second semiconductor layer 23 is disposed on the side opposite to the substrate 10 with respect to the active layer 21. In other words, in this example, the first semiconductor layer 22, the active layer 21, and the second semiconductor layer 23 are stacked in this order on the protruding portion 12 of the substrate 10. The second semiconductor layer 23 is configured by stacking a cladding layer 123, a block layer 124, a diffusion layer 125, and a contact layer 126 on the active layer 21 in this order. The cladding layer 123 has, for example, p-type conductivity. The diffusion layer 125 is formed by, for example, forming a layer corresponding to the block layer 124 and the diffusion layer 125 on the cladding layer 123 and then diffusing an impurity such as Zn at a part of the layer corresponding to the diffusion layer 125. As a result, a current flows more easily in the diffusion layer 125 than in the block layer 124.

The diffusion layer 125 has a part 125A formed so as to enter the block layer 124. By the part 125A being formed so as to enter the block layer 124, a recess 25A is formed in the region of a top surface 25 (described later) of the mesa portion 20 corresponding to the part 125A. The part 125A is formed in a circular shape and surrounded by the block layer 124 when viewed in the Z direction. Since it is more difficult for a current to flow in the block layer 124 than in the diffusion layer 125, a current supplied to the diffusion layer 125 is narrowed down to the part 125A by the block layer 124. In this manner, the block layer 124 and the diffusion layer 125 configure a current constriction structure that narrows down the flow of a current to the part 125A.

The mesa portion 20 has the top surface 25 and a side surface 26. The top surface 25 is the surface of the mesa portion 20 on the side opposite to the substrate 10 and extends in a planar shape along the X and Y directions. In this example, the top surface 25 is configured by the surface of the second semiconductor layer 23 on the side opposite to the active layer 21. The top surface 25 is, for example, formed in a rectangular shape (oblong or square shape) when viewed in the Z direction. In this example, the top surface 25 is formed in an oblong shape when viewed in the Z direction. The top surface 25 has a pair of first sides 25a and 25b extending along the Y direction (first direction) and a pair of second sides 25c and 25d extending along the X direction (second direction) when viewed in the Z direction. The first sides 25a and 25b are the short sides of the top surface 25, and the second sides 25c and 25d are the long sides of the top surface 25. The top surface 25 is formed with the recess 25A described above. The recess 25A is formed in a circular shape when viewed in the Z direction.

As illustrated in FIG. 5, the side surface 26 is formed in a curved surface shape convex toward the inside of the mesa portion 20. Likewise, a side surface 12a of the protruding portion 12 is also formed in a curved surface shape convex toward the inside of the protruding portion 12, and the side surface 26 is smoothly continuous with the side surface 12a. The side surface 26 being smoothly continuous with the side surface 12a means, for example, no step being formed at the boundary part between the side surface 26 and the side surface 12a. In this example, the side surface 26 and the side surface 12a are continuous with each other so as to form one smoothly curved surface.

Figure 2:
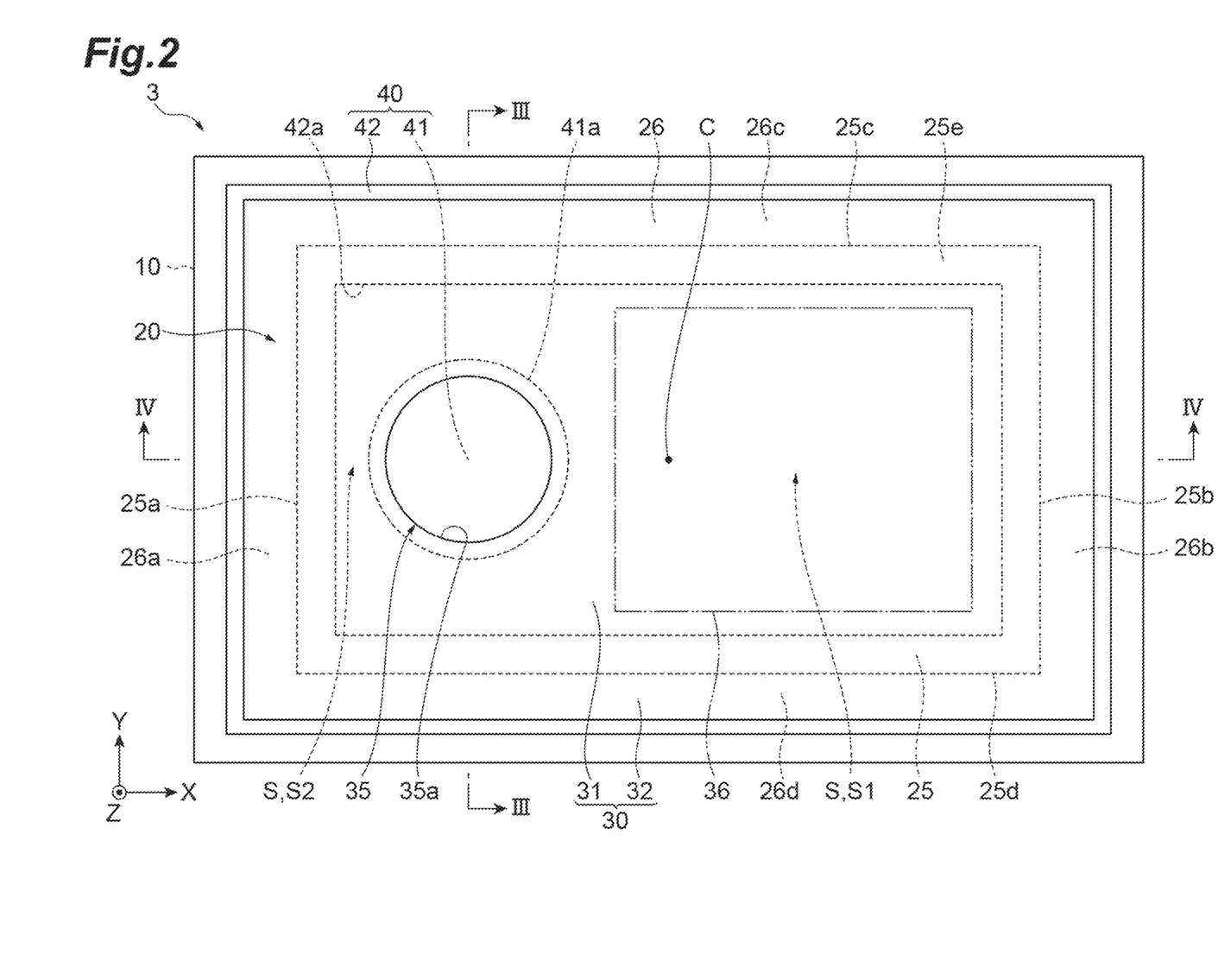
FIG. 2 is a plan view of a light emitting element illustrated in FIG. 1.

The side surface 26 has a pair of first surfaces 26a and 26b and a pair of second surfaces 26c and 26d (see FIG. 2). The pair of first surfaces 26a and 26b are connected to the top surface 25 on the pair of first sides 25a and 25b, respectively. In other words, the first surface 26a is connected to the top surface 25 on the first side 25a, and the first surface 26b is connected to the top surface 25 on the first side 25b. The pair of first surfaces 26a and 26b are respectively disposed on both sides of the top surface 25 in the X direction when viewed in the Z direction.

The pair of second surfaces 26c and 26d are connected to the top surface 25 on the pair of second sides 25c and 25d, respectively. In other words, the second surface 26c is connected to the top surface 25 on the second side 25c, and the second surface 26d is connected to the top surface 25 on the second side 25d. The pair of second surfaces 26c and 26d are respectively disposed on both sides of the top surface 25 in the Y direction when viewed in the Z direction.

As illustrated in FIGS. 1 and 2, the light emitting element 3 is disposed on the light receiving element 4 such that the second surface 26c faces the light receiving portion 402A and the second surface 26d faces the light receiving portion 402B when viewed in the Z direction. In other words, in this example, the second surface 26c of the mesa portion 20 configures a region facing the light receiving portion 402A when viewed in the Z direction, and the second surface 26d configures a region facing the light receiving portion 402B when viewed in the Z direction.

The metal layer 30 is formed of, for example, a metal material such as Cr, Au, Al, and Cu. The metal layer 30 has a first metal part 31 (first part) formed on the top surface 25 of the mesa portion 20 and a second metal part 32 (second part) formed on the side surface 26 of the mesa portion 20. The first metal part 31 is electrically connected to the second semiconductor layer 23 and functions as an electrode. The first metal part 31 includes an opening region 35 formed with a light passage opening 35a (light emitting window) through which light from the active layer 21 passes and a connection region 36 for external connection.

In this example, the light passage opening 35a is formed in a circular shape. Light from the active layer 21 is emitted to the outside of the light emitting element 3 through the light passage opening 35a. The light passage opening 35a is formed closer to the first surface 26a (one of the pair of first surfaces 26a and 26b) side than a center C of the top surface 25 when viewed in the Z direction. In other words, when viewed in the Z direction, the X-direction distance from the center of the light passage opening 35a to the first surface 26a is smaller than the X-direction distance from the center of the light passage opening 35a to the first surface 26b. The first metal part 31 is formed over the entire surface of the top surface 25 except for the part corresponding to the light passage opening 35a. The part of the top surface 25 corresponding to the light passage opening 35a is a part positioned inside the light passage opening 35a when viewed in the Z direction. The light passage opening 35a is formed at a position corresponding to the recess 25A described above (position overlapping the recess 25A when viewed in the Z direction).

The connection region 36 is, for example, a region where external wiring such as a wire electrically connecting the light emitting element 3 to the outside is connected, and functions as an external connection terminal. In this example, the connection region 36 is set in a rectangular shape and is disposed on the first surface 26b side of the opening region 35 when viewed in the Z direction.

The second metal part 32 is formed integrally with the first metal part 31 and extends along the side surface 26. The second metal part 32 is formed on the side surface 26 via a second insulating part 42 of the insulating layer 40 and a second resin part 52 of the resin layer 50, which will be described later. In this example, the second metal part 32 is formed on the side surface 26 over the entire circumference of the side surface 26 and extends in a rectangular ring shape when viewed in the Z direction. Specifically, the second metal part 32 is integrally formed on the first surfaces 26a and 26b and the second surfaces 26c and 26d so as to be continuous over the entire circumference of the side surface 26. In the Z direction, the second metal part 32 is formed so as to reach the side surface 12a of the protruding portion 12 from the side surface 26 of the mesa portion 20.

The insulating layer 40 is formed of, for example, SiN, $SiO_2$, or AlN. The insulating layer 40 has a first insulating part 41 formed on the top surface 25 of the mesa portion 20 and the second insulating part 42 formed on the side surface 26 of the mesa portion 20. The first insulating part 41 covers an exposed part 25f from the light passage opening 35a in the mesa portion 20. In this example, the first insulating part 41 is formed on the edge portion of the recess 25A on the top surface 25 and the bottom and inner peripheral surfaces of the recess 25A and functions as a passivation film protecting the exposed part 25f. The first insulating part 41 is formed in, for example, a circular shape when viewed in the Z direction.

The second insulating part 42 is integrally formed over the top surface 25 and the side surface 26 of the mesa portion 20 and the side surface 12a of the protruding portion 12. In other words, in this example, the second insulating part 42 has a top portion 43 formed on the top surface 25 and a main body portion 44 formed on the side surface 26. The top portion 43 is formed on an outer edge region 25e of the top surface 25 and is formed in a rectangular ring shape when viewed in the Z direction. The outer edge region 25e is a rectangular ring-shaped region extending along the outer edge of the top surface 25 (first sides 25a and 25b and second sides 25c and 25d). The main body portion 44 is formed so as to reach the side surface 12a from the side surface 26. The main body portion 44 is continuously formed over the entire circumference of the side surface 26. Specifically, the main body portion 44 is integrally formed on the first surfaces 26a and 26b and the second surfaces 26c and 26d so as to be continuous over the entire circumference of the side surface 26. The main body portion 44 extends along the side surface 26 and has a curved surface shape convex toward the inside of the mesa portion 20.

The resin layer 50 is formed of, for example, a resin material such as polyimide and epoxy. As illustrated in FIG. 5, the resin layer 50 has a first resin part 51 formed on the top surface 25 of the mesa portion 20 and the second resin part 52 formed on the side surface 26 of the mesa portion 20. The first resin part 51 is formed on the top surface 25 via the top portion 43 of the second insulating part 42. The first resin part 51 extends along the outer edge of the top surface 25 and is formed in a rectangular ring shape when viewed in the Z direction. The thickness of the first resin part 51 is, for example, approximately 2 μm.

The second resin part 52 is formed integrally with the first resin part 51 and formed on the side surface 26 of the mesa portion 20 via the main body portion 44 of the second insulating part 42. In this example, the second resin part 52 is continuously formed over the entire circumference of the side surface 26. Specifically, the second resin part 52 is integrally formed on the first surfaces 26a and 26b and the second surfaces 26c and 26d so as to be continuous over the entire circumference of the side surface 26.

Figure 6:
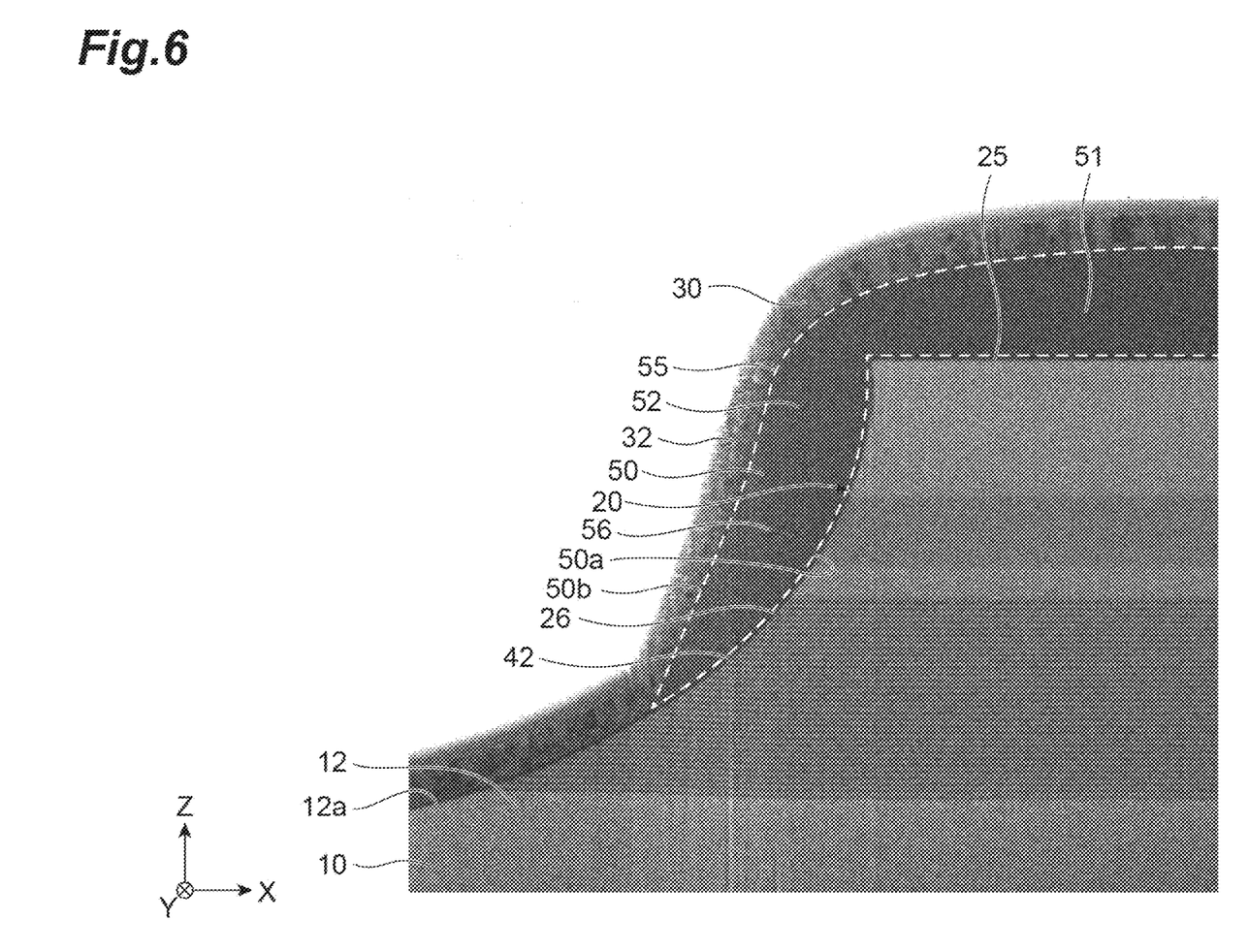
FIG. 6 is a photograph showing a part of a cross section of the light emitting element.
Figure 7:
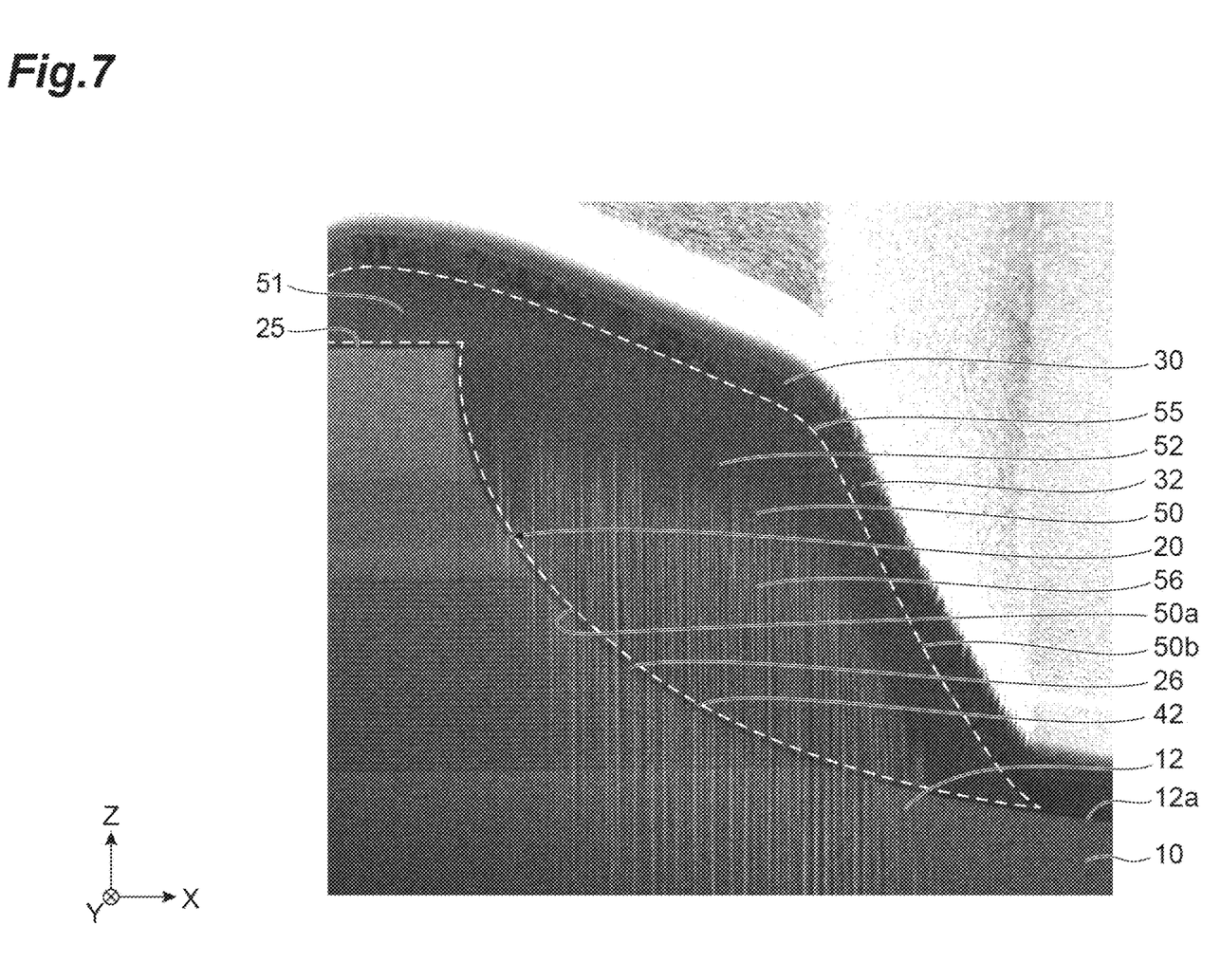
FIG. 7 is a photograph showing a part of a cross section of the light emitting element.

Next, the configuration of the resin layer 50 will be further described with reference to FIGS. 6 and 7 as well. An example of the resin layer 50 is illustrated in FIG. 6, and another example of the resin layer 50 is illustrated in FIG. 7. The part surrounded by the white broken line in FIGS. 6 and 7 is the resin layer 50. The resin layer 50 may have the configuration illustrated in FIG. 6 or may have the configuration illustrated in FIG. 7.

The resin layer 50 has a surface 50a on the mesa portion 20 side and a surface 50b on the side opposite to the mesa portion 20. The surface 50a extends along the top surface 25 and the side surface 26 of the mesa portion 20. The part of the surface 50a along the top surface 25 extends along the X and Y directions. The part of the surface 50a along the side surface 26 has a curved surface shape convex toward the inside of the mesa portion 20. The entire surface of the surface 50a is in contact with the second insulating part 42.

The surface 50b has a gentle shape that swells toward the side opposite to the mesa portion 20 as a whole. The surface 50b includes a region 55 formed in a curved surface shape convex toward the side opposite to the mesa portion 20. The entire surface of the surface 50b is covered with the metal layer 30. That is, in this example, the entire surface of the resin layer 50 (surfaces 50a and 50b) is covered with the metal layer 30 and the second insulating part 42 and is not exposed.

The second resin part 52 of the resin layer 50 includes a thinned part 56 with a thickness decreasing toward the substrate 10. The thinned part 56 is formed between the second metal part 32 of the metal layer 30 and the second insulating part 42 of the insulating layer 40. As a result, the interval between the second metal part 32 and the second insulating part 42 becomes narrow toward the substrate 10. In this example, the second metal part 32 and the second insulating part 42 are in contact with each other at the end portion of the thinned part 56 on the substrate 10 side. The thickness (maximum thickness) of the second resin part 52 is, for example, approximately 1 µm to 20 µm. The thickness of the second resin part 52 is a thickness in a direction perpendicular to the Z direction.

Details of Metal Layer, Insulating Layer, and Resin Layer

The configurations of the metal layer 30, the insulating layer 40, and the resin layer 50 will be further described below. As illustrated in FIG. 2, a space S is formed between an outer edge 41a of the first insulating part 41 and an inner edge 42a of the second insulating part 42 when viewed in the Z direction, and the top surface 25 is exposed from the insulating layer 40 in the space S. The first metal part 31 of the metal layer 30 is in contact with the top surface 25 in the space S and is electrically connected to the second semiconductor layer 23.

In addition, as illustrated in FIG. 2, the space S includes a first space S1 positioned on the first surface 26b side with respect to the outer edge 41a and a second space S2 positioned on the first surface 26a side with respect to the outer edge 41a. As described above, the first insulating part 41 is formed closer to the first surface 26a side than the center C of the top surface 25 when viewed in the Z direction. Therefore, the first space S1 has a wider width in the X direction than the second space S2. The connection region 36 of the first metal part 31 is positioned in the first space S1. In the connection region 36, the first metal part 31 is directly formed on the top surface 25 of the mesa portion 20 without the insulating layer 40 and the resin layer 50 interposed therebetween. In other words, the first resin part 51 of the resin layer 50 is not formed between the connection region 36 and the top surface 25.

As described above, the second metal part 32 of the metal layer 30 is formed on the side surface 26 of the mesa portion 20 via the second insulating part 42 of the insulating layer 40 and the second resin part 52 of the resin layer 50. The second metal part 32 overlaps (covers) the active layer 21, the first semiconductor layer 22, and the second semiconductor layer 23 when viewed in a direction perpendicular to the Z direction (for example, X or Y direction). In this example, the second metal part 32 reaches the end portion of the mesa portion 20 on the substrate 10 side (end portion of the side surface 26 on the substrate 10 side) when viewed in a direction perpendicular to the Z direction, and the end portion of the second metal part 32 on the substrate 10 side is positioned on the side surface 12a of the protruding portion 12. In other words, the second metal part 32 overlaps not only the side surface 26 but also the side surface 12a when viewed in a direction perpendicular to the Z direction.

As illustrated in FIGS. 6 and 7, the part of the second metal part 32 formed on the resin layer 50 extends along the surface 50b of the resin layer 50 and has a gentle shape that swells toward the side opposite to the mesa portion 20 as a whole. The part of the second metal part 32 formed on the region 55 of the surface 50b is formed in a curved surface shape convex toward the side opposite to the mesa portion 20.

As illustrated in FIGS. 1 and 2, in the reflective-type encoder 1, the second metal part 32 on the second surface 26c of the mesa portion 20 is disposed between the second surface 26c and the light receiving portion 402A when viewed in the Z direction, and the second metal part 32 on the second surface 26d of the mesa portion 20 is disposed between the second surface 26d and the light receiving portion 402B when viewed in the Z direction. As a result, light leaking out of the second surfaces 26c and 26d is blocked by the second metal part 32, and incidence of leakage light from the second surfaces 26c and 26d on the light receiving portions 402A and 402B is suppressed.

Action and Effect

In the light emitting element 3, the metal layer 30 has the second metal part 32 formed integrally with the first metal part 31 and extending along the side surface 26 of the mesa portion 20 in addition to the first metal part 31 disposed on the top surface 25 of the mesa portion 20 and electrically connected to the second semiconductor layer 23, and the second metal part 32 overlaps the active layer 21 when viewed in a direction perpendicular to the Z direction. As a result, light leaking out of the side surface 26 of the mesa portion 20 can be blocked by the second metal part 32, and leakage light from the side surface 26 of the mesa portion 20 can be suppressed. For example, if the metal layer 30 does not have the second metal part 32, leakage light Lim from the side surface 26 may be directly incident on the light receiving portion 402 as illustrated in FIG. 1. On the other hand, in the light emitting element 3 described above, the leakage light Lim is blocked by the second metal part 32, and thus incidence of the leakage light Lim on the light receiving portion 402 is suppressed. In addition, it may be impossible to satisfactorily form the metal layer 30 simply by forming the metal layer 30 on the side surface 26 of the mesa portion 20. On the other hand, the second metal part 32 of the metal layer 30 in this light emitting element 3 is formed on the side surface 26 of the mesa portion 20 via the insulating layer 40 and the resin layer 50. As a result, the second metal part 32 of the metal layer 30 can be satisfactorily formed on the side surface 26 of the mesa portion 20 and, as a result, leakage light from the side surface 26 of the mesa portion 20 can be effectively suppressed. More specifically, the side surface 26 may become uneven when, for example, the mesa portion 20 is manufactured and, in this case, it may be difficult to form the second metal part 32 on the side surface 26. In addition, the side surface 26 having a curved surface shape convex toward the inside of the mesa portion 20 may also make it difficult to form the second metal part 32 on the side surface 26. On the other hand, in the light emitting element 3, the second metal part 32 is formed on the side surface 26 via the resin layer 50, and thus the second metal part 32 can be improved in attachment by the side surface 26 being gentle in shape and the second metal part 32 can be satisfactorily formed on the side surface 26. From the above, according to the light emitting element 3, a decline in detection accuracy can be suppressed in the case of application to the reflective-type encoder 1.

In general, from the viewpoint of suppressing an increase in parasitic capacitance, a configuration in which the metal layer 30 is extended more than necessary is not suitable, and thus it is conceivable that a configuration is not adopted in which the metal layer 30 electrically connected to the second semiconductor layer 23 on the top surface 25 of the mesa portion 20 is extended up to the side surface 26 of the mesa portion 20. On the other hand, in the light emitting element 3, leakage light from the side surface 26 of the mesa portion 20 is suppressed by intentionally extending the metal layer 30 so as to reach the side surface 26 of the mesa portion 20. In addition, although the first metal part 31 and the second metal part 32 may unintentionally come into contact with each other if the first metal part 31 and the second metal part 32 in the metal layer 30 are formed separately from each other, in the light emitting element 3, the occurrence of such unintended contact is suppressed since the first metal part 31 and the second metal part 32 are integrally formed.

The second metal part 32 reaches the end portion of the mesa portion 20 on the substrate 10 side when viewed in a direction perpendicular to the Z direction. As a result, leakage light from the side surface 26 of the mesa portion 20 can be suppressed more effectively.

At the first metal part 31, the light passage opening 35a is formed closer to the first surface 26a side than the center C of the top surface 25 when viewed in the Z direction, and the second metal part 32 is formed on the first surface 26a and the pair of second surfaces 26c and 26d. As a result, the light passage opening 35a is formed close to the first surface 26a at the first metal part 31, and thus the wide connection region 36 for external connection can be ensured. As a result, for example, connection of external wiring to the connection region 36 can be facilitated. Meanwhile, in that case, light is likely to leak out of the first surface 26a. In this regard, in the light emitting element 3, the second metal part 32 is formed on the first surface 26a and the pair of second surfaces 26c and 26d, and thus leakage light from the side surface 26 of the mesa portion 20 can be reliably suppressed even in such a case.

The second metal part 32 is formed over the entire circumference of the side surface 26 of the mesa portion 20. As a result, leakage light from the side surface 26 of the mesa portion 20 can be suppressed more effectively.

The resin layer 50 includes the thinned part 56 with a thickness decreasing toward the substrate 10. As a result, the surface 50b of the resin layer 50 on the side opposite to the mesa portion 20 can be made gentle, and the second metal part 32 of the metal layer 30 can be more satisfactorily formed on the side surface 26 of the mesa portion 20. In addition, light incident on the resin layer 50 from the side surface 26 of the mesa portion 20 can be efficiently attenuated. Specifically, the light that has leaked out to the resin layer 50 from the side surface 26 of the mesa portion 20 is attenuated by being repeatedly reflected between the side surface 26 of the mesa portion 20 and the second metal part 32 of the metal layer 30. As the thickness of the resin layer 50 decreases, the interval between the side surface 26 of the mesa portion 20 and the second metal part 32 of the metal layer 30 decreases and the number of leakage light reflections increases, and thus the leakage light can be efficiently attenuated. In the light emitting element 3, the resin layer 50 includes the thinned part 56 with a thickness decreasing toward the substrate 10, and thus light incident on the resin layer 50 from the side surface 26 of the mesa portion 20 can be efficiently attenuated. In addition, if leakage light from the side surface 26 can be efficiently attenuated, even when, for example, an unintended hole is formed at the second metal part 32, light leakage from the hole can be suppressed. Further, if leakage light from the side surface 26 can be efficiently attenuated, light from the active layer 21 leaking out of the side surface of the substrate 10 can be suppressed. It should be noted that although light generated in the active layer 21 is absorbed by the substrate 10 and thus light does not leak out of the side surface of the substrate 10 in the light emitting element 3 of the above embodiment, it is effective to efficiently attenuate leakage light from the side surface of the substrate 10 when light in a wavelength band that is not absorbed by the substrate 10 is generated in the active layer 21.

The side surface 26 of the mesa portion 20 is formed in a curved surface shape convex toward the inside of the mesa portion 20. In this case, it becomes difficult to form the second metal part 32 of the metal layer 30 on the side surface 26 of the mesa portion 20. However, according to the light emitting element 3, for the reason described above, the second metal part 32 can be satisfactorily formed on the side surface 26 even in such a case.

The surface 50b of the resin layer 50 on the side opposite to the mesa portion 20 includes the region 55 formed in a curved surface shape convex toward the side opposite to the mesa portion 20. As a result, the second metal part 32 of the metal layer 30 can be more satisfactorily formed on the side surface 26 of the mesa portion 20.

The metal layer 30 covers the entire surface 50b of the resin layer 50 on the side opposite to the mesa portion 20. As a result, leakage light from the side surface 26 of the mesa portion 20 can be suppressed more effectively. In addition, deterioration of the resin layer 50 attributable to contact with air can be effectively suppressed.

The resin layer 50 has the first resin part 51 formed on the top surface 25 of the mesa portion 20 while the first resin part 51 of the resin layer 50 is not formed between the connection region 36 and the top surface 25 of the mesa portion 20 at the first metal part 31. As a result, the resin layer 50 is formed not only on the side surface 26 of the mesa portion 20 but also on the top surface 25, and thus the resin layer 50 can be formed satisfactorily. In addition, when the resin layer 50 is formed on the top surface 25 of the mesa portion 20 as well, the resin layer 50 is configured to be positioned on the connection part between the top surface 25 and the side surface 26 of the mesa portion 20. As a result, the metal layer 30 can be more satisfactorily formed on the resin layer 50. In addition, by the resin layer 50 being positioned on the connection part between the top surface 25 and the side surface 26 of the mesa portion 20, the part of the metal layer 30 positioned on the top surface 25 of the mesa portion 20 and the part of the metal layer 30 positioned on the side surface 26 of the mesa portion 20 are gently connected, and thus breakage of the metal layer 30 can be suppressed. In addition, since the resin layer 50 is not formed between the connection region 36 and the top surface 25 at the first metal part 31, the occurrence of a situation can be suppressed in which external wiring cannot be satisfactorily connected to the connection region 36 due to the presence of the resin layer 50. In other words, if the resin layer 50 is formed between the first metal part 31 and the top surface 25 in the connection region 36, the contact surface of external wiring becomes soft and it may become difficult to connect the external wiring. On the other hand, in the light emitting element 3, the resin layer 50 is not formed between the connection region 36 and the top surface 25 at the first metal part 31, and thus the occurrence of such a situation can be suppressed.

The first resin part 51 of the resin layer 50 extends along the outer edge of the top surface 25 of the mesa portion 20 when viewed in the Z direction. As a result, the resin layer 50 is formed not only on the side surface 26 of the mesa portion 20 but also on the top surface 25 of the mesa portion 20, and thus the resin layer 50 can be formed satisfactorily. In addition, the first resin part 51 extends along the outer edge of the top surface 25 of the mesa portion 20 when viewed in the Z direction, and thus the occurrence of a situation can be suppressed in which external wiring cannot be satisfactorily connected to the connection region 36 due to the presence of the resin layer 50.

The insulating layer 40 has the first insulating part 41 formed on the top surface 25 of the mesa portion 20 and covering the exposed part 25f from the light passage opening 35a. As a result, the exposed part 25f can be protected by the first insulating part 41.

The first metal part 31 is formed over the entire surface of the top surface 25 of the mesa portion 20 except for the part corresponding to the light passage opening 35a. As a result, the wide connection region 36 for external connection can be ensured at the first metal part 31 and, for example, connection of external wiring to the connection region 36 can be facilitated. In addition, the first metal part 31 is simpler in shape than when, for example, the first metal part 31 is formed as a complicated wiring pattern, and thus the occurrence of an unintended short circuit between the first metal parts 31 can be suppressed.

In the reflective-type encoder 1, the light receiving portion 402 includes the two light receiving portions 402A and 402B respectively disposed on both sides of the light emitting element 3 in a direction perpendicular to the Z direction, and the second metal part 32 is formed on the side surface 26 of the mesa portion 20 on the two regions (second surfaces 26c and 26d) respectively facing the two light receiving portions 402A and 402B when viewed in the Z direction. As a result, the second metal part 32 is capable of blocking leakage light incident on the two light receiving portions 402A and 402B disposed on both sides of the light emitting element 3 from the side surface 26 of the mesa portion 20.

MODIFICATION EXAMPLE

The present disclosure is not limited to the above embodiment. For example, the material and shape of each configuration are not limited to those described above and various materials and shapes can be adopted. Although the top surface 25 of the mesa portion 20 in the above embodiment is formed in an oblong shape when viewed in the Z direction, the top surface 25 may be formed in a square, circular, or elliptical shape. In this case, the side surface 26 of the mesa portion 20 may be formed in a square ring shape, a circular ring shape, or an elliptical ring shape when viewed in the Z direction.

Although the mesa portion 20 in the above embodiment has a current constriction structure configured by the block layer 124 and the diffusion layer 125, the mesa portion 20 may not have the current constriction structure. However, when the current constriction structure is provided, the light emitting point (emitted light) can be narrowed and noise generation in the reflective-type encoder 1 can be suppressed. The recess 25A may not be formed in the top surface 25 of the mesa portion 20, and the entire top surface 25 may be formed flat along the X and Y directions.

Although the light passage opening 35a in the above embodiment is formed closer to the first surface 26a side than the center C of the top surface 25 when viewed in the Z direction, the position of the light passage opening 35a is not limited. For example, the light passage opening 35a may be formed at the center C of the top surface 25 when viewed in the Z direction. Although the light passage opening 35a is formed in a circular shape in the above embodiment, the light passage opening 35a may be formed in a rectangular or elliptical shape.

Although the insulating layer 40 in the above embodiment has parts formed on the top surface 25 of the mesa portion 20 (the first insulating part 41 and the top portion 43 of the second insulating part 42), the insulating layer 40 may be formed at least on the side surface 26 of the mesa portion 20 and may have only the main body portion 44 of the second insulating part 42.

Although the resin layer 50 in the above embodiment has the first resin part 51 formed on the top surface 25, the resin layer 50 may be formed at least on the side surface 26 and may have only the second resin part 52. In the above embodiment, the resin layer 50 may be formed between the connection region 36 of the first metal part 31 and the top surface 25 of the mesa portion 20.

Although the first metal part 31 of the metal layer 30 in the above embodiment is formed over the entire surface of the top surface 25 of the mesa portion 20 except for the part corresponding to the light passage opening 35a, the first metal part 31 may be partially formed on the entire surface.

Although the second metal part 32 of the metal layer 30 in the above embodiment overlaps the active layer 21, the first semiconductor layer 22, the second semiconductor layer 23, and the side surface 12a of the protruding portion 12 when viewed in a direction perpendicular to the Z direction, the second metal part 32 may overlap at least the active layer 21. For example, the end portion of the second metal part 32 on the substrate 10 side may be positioned on the side surface of the first semiconductor layer 22 instead of the side surface 12a of the protruding portion 12.

Although the second metal part 32 of the metal layer 30 in the above embodiment is formed over the entire circumference of the side surface 26, the second metal part 32 may not be formed over the entire circumference of the side surface 26. For example, the second metal part 32 may not be formed on the first surface 26b, which is farthest from the light passage opening 35a when viewed in the Z direction among the first surfaces 26a and 26b and the second surfaces 26c and 26d. The region where the second metal part 32 is formed on the side surface 26 may be determined based on the positional relationship with the light receiving portion 402. For example, when the two light receiving portions 402A and 402B are disposed on both sides of the light emitting element 3 in the Y direction as in the above embodiment, the second metal part 32 may be formed only on the two second surfaces 26c and 26d, which respectively face the two light receiving portions 402A and 402B when viewed in the Z direction, without the second metal part 32 being formed on the first surfaces 26a and 26b. In other words, the second metal part 32 may be formed only on the region of the side surface 26 facing the light receiving portion 402 (directed to the light receiving portion 402) where incidence of leakage light is to be suppressed when viewed in the Z direction.

Although the light receiving element 4 in the above embodiment has the plurality of light receiving portions 402, the light receiving portion 402 is not limited in number. The light receiving element 4 may have at least one light receiving portion 402. When there is one light receiving portion 402, the second metal part 32 of the metal layer 30 may be formed only on the region of the side surface 26 facing the single light receiving portion 402 when viewed in the Z direction. Also in this case, as in the above embodiment, a decline in detection accuracy can be suppressed in the case of application to the reflective-type encoder 1. Although the reflective-type encoder 1 in the above embodiment includes only one light receiving element 4, the reflective-type encoder 1 may include a plurality of the light receiving elements 4.

The light emitting element 3 may be disposed such that the first surface 26a of the mesa portion 20 faces the light receiving portion 402A and the first surface 26b of the mesa portion 20 faces the light receiving portion 402B when viewed in the Z direction. In this case, the second metal part 32 of the metal layer 30 may be formed only on the first surfaces 26a and 26b without being formed on the second surfaces 26c and 26d.

Although the side surface 26 of the mesa portion 20 in the above embodiment is formed in a curved surface shape convex toward the inside of the mesa portion 20, the side surface 26 may be formed in a planar shape inclined with respect to the Z direction.

Although the metal layer 30 in the above embodiment covers the entire surface of the surface 50b of the resin layer 50, the metal layer 30 may not cover the entire surface of the surface 50b. In other words, a part of the surface 50b may be exposed from the metal layer 30. Although the surface 50b in the above embodiment includes the region 55 formed in a curved surface shape convex toward the side opposite to the mesa portion 20, the surface 50b does not necessarily have to include the region 55.

The substrate 10 may not have the protruding portion 12. In this case, for example, the substrate 10 may be formed in a rectangular plate shape (rectangular parallelepiped shape) as a whole and the mesa portion 20 may be formed on the main surface of the substrate 10. The mesa portion 20 may have a vertical mesa structure formed in a rectangular shape in a cross section along the Z direction. In this case, the side surface 26 of the mesa portion 20 may extend along the Z direction.

The shape of the connection region 36 is not limited insofar as external wiring such as a wire is connectable. For example, the connection region 36 may be circular or elliptical. The connection region 36 may be the entire part of the first metal part 31 excluding the light passage opening 35a. In other words, in the above embodiment, the connection region 36 may be positioned over the entire surface of the top surface 25 of the mesa portion 20 excluding the part corresponding to the light passage opening 35a.

What is claimed is:

1. A light emitting element comprising:
   a substrate;
   a mesa portion formed on the substrate and including an active layer that generates light, a first semiconductor layer disposed on a side of the substrate with respect to the active layer, and a second semiconductor layer disposed on a side opposite to the substrate with respect to the active layer;
   a metal layer including a first part disposed on a top surface of the mesa portion and electrically connected to the second semiconductor layer and a second part formed integrally with the first part and extending along a side surface of the mesa portion;
   an insulating layer formed at least on the side surface of the mesa portion; and
   a resin layer formed on the insulating layer, wherein
   the first part includes a region formed with a light passage opening through which the light passes and a region for external connection, and
   the second part is formed on the side surface of the mesa portion via the insulating layer and the resin layer and overlaps at least the active layer when viewed in a direction perpendicular to a thickness direction of the substrate.

2. The light emitting element according to claim 1, wherein the second part reaches an end portion of the mesa portion on the side of the substrate when viewed in the direction perpendicular to the thickness direction of the substrate.

3. The light emitting element according to claim 1, wherein
   the top surface of the mesa portion is formed in a rectangular shape having a pair of first sides extending along a first direction and a pair of second sides extending along a second direction perpendicular to the first direction when viewed in the thickness direction of the substrate,
   the side surface of the mesa portion includes a pair of first surfaces respectively connected to the top surface on the pair of first sides and a pair of second surfaces respectively connected to the top surface on the pair of second sides,
   at the first part, the light passage opening is formed closer to a side of one of the pair of first surfaces than a center of the top surface when viewed in the thickness direction of the substrate, and
   the second part is formed at least on the one of the pair of first surfaces and the pair of second surfaces.

4. The light emitting element according to claim 1, wherein the second part is formed over an entire circumference of the side surface of the mesa portion.

5. The light emitting element according to claim 1, wherein the resin layer includes a part with a thickness decreasing toward the substrate.

6. The light emitting element according to claim 1, wherein the side surface of the mesa portion is formed in a curved surface shape convex toward an inside of the mesa portion.

7. The light emitting element according to claim 1, wherein a surface of the resin layer on a side opposite to the mesa portion includes a region formed in a curved surface shape convex toward the side opposite to the mesa portion.

8. The light emitting element according to claim 1, wherein the metal layer covers an entire surface of the resin layer on a side opposite to the mesa portion.

9. The light emitting element according to claim 1, wherein the resin layer includes a part formed on the top surface of the mesa portion and is not formed between the region for external connection of the first part and the top surface of the mesa portion.

10. The light emitting element according to claim 1, wherein
the resin layer includes a part formed on the top surface of the mesa portion, and
the part of the resin layer extends along an outer edge of the top surface of the mesa portion when viewed in the thickness direction of the substrate.

11. The light emitting element according to claim 1, wherein the insulating layer includes a part formed on the top surface of the mesa portion and covering an exposed part from the light passage opening.

12. The light emitting element according to claim 1, wherein the first part is formed over an entire surface of the top surface of the mesa portion excluding a part corresponding to the light passage opening.

13. A reflective-type encoder comprising:
the light emitting element according to claim 1;
a rotating plate including a reflection pattern that reflects the light emitted from the light emitting element; and
at least one light receiving portion that is disposed on the same side as the light emitting element with respect to the rotating plate and detects the light reflected by the reflection pattern,
wherein the second part is formed at least on a region of the side surface of the mesa portion facing the at least one light receiving portion when viewed in the thickness direction of the substrate.

14. The reflective-type encoder according to claim 13, wherein
the at least one light receiving portion includes two light receiving portions respectively disposed on both sides of the light emitting element in the direction perpendicular to the thickness direction of the substrate, and
the second part is formed at least on two regions of the side surface of the mesa portion respectively facing the two light receiving portions when viewed in the thickness direction of the substrate.

* * * * *